(12) United States Patent
Yoshikawa et al.

(10) Patent No.: US 11,363,744 B2
(45) Date of Patent: Jun. 14, 2022

(54) COOLING SYSTEM AND COOLING METHOD

(71) Applicant: NEC Corporation, Tokyo (JP)

(72) Inventors: Minoru Yoshikawa, Tokyo (JP); Hisato Sakuma, Tokyo (JP); Yoshinori Miyamoto, Tokyo (JP); Masaki Chiba, Tokyo (JP)

(73) Assignee: NEC CORPORATION, Tokyo (JP)

(*) Notice: Subject to any disclaimer, the term of this patent is extended or adjusted under 35 U.S.C. 154(b) by 297 days.

(21) Appl. No.: 16/643,896

(22) PCT Filed: Sep. 6, 2017

(86) PCT No.: PCT/JP2017/032128
§ 371 (c)(1),
(2) Date: Mar. 3, 2020

(87) PCT Pub. No.: WO2019/049241
PCT Pub. Date: Mar. 14, 2019

(65) Prior Publication Data
US 2020/0281091 A1 Sep. 3, 2020

(51) Int. Cl.
*H05K 7/20* (2006.01)

(52) U.S. Cl.
CPC ....... *H05K 7/2079* (2013.01); *H05K 7/20145* (2013.01); *H05K 7/20154* (2013.01); *H05K 7/20272* (2013.01); *H05K 7/20745* (2013.01)

(58) Field of Classification Search
CPC ............ H05K 7/2079; H05K 7/20145; H05K 7/20154; H05K 7/20272; H05K 7/20745; H05K 7/20736
See application file for complete search history.

(56) References Cited

U.S. PATENT DOCUMENTS

| 7,957,142 B2* | 6/2011 | Noteboom | G06F 1/20 165/122 |
| 8,184,435 B2* | 5/2012 | Bean, Jr. | H05K 7/20745 361/679.48 |

(Continued)

FOREIGN PATENT DOCUMENTS

| JP | 2009-257730 A | 11/2009 |
| JP | 2012-037193 A | 2/2012 |

(Continued)

OTHER PUBLICATIONS

Japanese Office Action for JP Application No. 2019-540184 dated Mar. 9, 2021 with English Translation.
International Search Report for PCT Application No. PCT/JP2017/032128, dated Dec. 12, 2017.
English translation of Written opinion for PCT Application No. PCT/JP2017/032128.

*Primary Examiner* — Jon T. Schermerhorn, Jr.
(74) *Attorney, Agent, or Firm* — Sughrue Mion, PLLC

(57) ABSTRACT

When an enclosed space is formed, by at least one of surfaces forming an exterior shape of a shielding member and an intake or exhaust surface among surfaces forming an exterior shape of heat-generating housings, in such a way that a taken-in airflow and an exhausted airflow of the heat-generating housings installed in at least two rows can be separated or substantially separated, a cooling system includes: a duct formed to be able to separate or substantially separate a first airflow and a second airflow being intake/exhaust of a specific heat-generating housing among the heat-generating housings, and heat-generating housings other than the specific heat-generating housing, respectively; and a cooling enhancement unit enhancing cooling for the specific heat-generating housing by acting on the first airflow, thereby avoiding occurrence of a hot spot due to a high-heat-generating housing, in a system building an air-conditioning environment such as aisle capping.

13 Claims, 8 Drawing Sheets

(56) References Cited

U.S. PATENT DOCUMENTS

| | | | |
|---|---|---|---|
| 8,320,128 B2* | 11/2012 | Wei | H05K 7/20754 165/104.19 |
| 9,545,034 B2* | 1/2017 | Slaby | F24F 7/08 |
| 9,648,784 B2* | 5/2017 | Keisling | H05K 7/20745 |
| 10,716,241 B2* | 7/2020 | Keisling | H05K 7/20745 |
| 2010/0188816 A1 | 7/2010 | Bean et al. | |
| 2010/0315775 A1* | 12/2010 | Grantham | H05K 7/20745 361/688 |
| 2013/0019621 A1* | 1/2013 | Wood | A47F 3/0447 62/126 |
| 2013/0025826 A1 | 1/2013 | Sakamoto et al. | |
| 2016/0279556 A1* | 9/2016 | Law | B04C 5/26 |

FOREIGN PATENT DOCUMENTS

| | | |
|---|---|---|
| JP | 2012-084700 A | 4/2012 |
| JP | 2012-516570 A | 7/2012 |
| JP | 2012-524940 A | 10/2012 |
| JP | 2015-125577 A | 7/2015 |
| JP | 2017-003219 A | 1/2017 |
| JP | 2017-015341 A | 1/2017 |
| JP | 2017-017199 A | 1/2017 |
| WO | 2011/122332 A1 | 10/2011 |

* cited by examiner

COOLING SYSTEM AND COOLING METHOD

This application is a National Stage Entry of PCT/JP2017/032128 filed on Sep. 6, 2017, the contents of all of which are incorporated herein by reference, in their entirety.

TECHNICAL FIELD

The present invention relates to a technique of cooling heat-generating housings in such a way that airflow being taken in by a plurality of heat-generating housings being installed side by side and airflow being exhausted by the plurality of heat-generating housings are separated or substantially separated, in an air-conditioning environment in which an intake aisle or an exhaust aisle is capped.

BACKGROUND ART

In a data center and a communication station in which a large-scale information processing system is built, a large number of racks (heat-generating housings) densely mounted with electronic devices are usually installed. Quantity of heat generated by those electronic devices is enormous, and therefore a cooling (air-conditioning) system that is able to cool an electronic device with efficiency is in demand. As one of techniques for achieving such a cooling system, aisle capping (registered trademark) is known. Aisle capping is a technique of capping (enclosing a space by use of a member that is able to block airflow) an intake aisle or an exhaust aisle in such a way that cool air provided by an air conditioner and warm air exhausted from an electronic device are not mixed. Note that, the intake aisle is a space (an aisle for maintenance work, being held between two rows of rack groups) enclosed by intake surfaces of a plurality of electronic devices being installed side by side in such a way that the intake surfaces are directed to the same direction, and a capping member. The exhaust aisle is a space (an aisle for maintenance work, being held between two rows of rack groups) enclosed by exhaust surfaces of a plurality of electronic devices being installed side by side in such a way that the exhaust surfaces are directed to the same direction, and a capping member.

As a technique related to the above-mentioned aisle capping, PTL 1 discloses a device to which a slide bar is fixed in such a way as to protrude to the front direction or the back direction of a rack from a top part of the rack, in order to control a path of airflow flowing for exhausting heat of equipment housed in the rack. In the device, an aisle curtain made of a material which blocks airflow is removably attached to the slide bar, in order to surround a cool-air inlet (or a warm-air outlet) and the front or the back of the rack.

Further, PTL 2 discloses an air-conditioning system including an air conditioner which takes in exhausted air exhausted from electronic devices housed in a plurality of racks disposed side by side, cools the exhausted air, and supplies cooled air-conditioning air to the electronic devices. The air-conditioning system includes a chamber unit into which air-conditioning air is flown from an air conditioner, and the chamber unit is disposed in a position opposite to an intake space being a space, between at least a plurality of racks, from which an electronic device takes in air to be used for cooling, within a space between an equipment room in which a plurality of racks are disposed, and the air conditioner disposed outside of the equipment room. The chamber unit includes a blow unit in a position facing the intake space on a side wall forming a partition between the chamber unit and the equipment room, and the blow unit sends out air-conditioning air in a direction to which the intake space extends.

Further, PTL 3 discloses a cooling system for cooling air by containing the air in between two rows of equipment racks. The cooling system includes a canopy assembly configured in such a way as to seal a hot aisle partitioned by two rows of equipment racks, and a cooling means embedded in the canopy assembly. The cooling means is configured in such a way as to cool air contained in the hot aisle.

Further, PTL 4 discloses an air-conditioning system including a device housing rack, a hot aisle, a cold aisle, an air-conditioning unit, and a duct. The hot aisle is formed adjacent to an exhaust side of the device housing rack, and communicates with an internal housing space. The cold aisle is partitioned from the hot aisle, is formed adjacent to an intake side being opposite to the exhaust side of the device housing rack, and communicates with the internal housing space. The duct is formed in such a way that at least either one of an air-return path from the hot aisle to the air-conditioning unit and an air-supply path from the air-conditioning unit to the cold aisle extends, when viewed in planer view in the hot aisle or the cold aisle, along a longitudinal direction of the device housing rack. Further, the duct is made of a flexible sheet with air permeability and flexibility.

CITATION LIST

Patent Literature

[PTL 1] Japanese Unexamined Patent Application Publication No. 2012-084700
[PTL 2] Japanese Unexamined Patent Application Publication No. 2017-015341
[PTL 3] Japanese Unexamined Patent Application Publication (Translation of PCT Application) No. 2012-516570
[PTL 4] Japanese Unexamined Patent Application Publication No. 2017-003219

SUMMARY OF INVENTION

Technical Problem

In a system in which an air-conditioning environment such as the above-mentioned aisle capping is built, a problem to be described as follows occurs when there is a heat-generating housing (high-heat-generating housing) having a particularly high heating value compared to other heat-generating housings. Specifically, a rotation number of a fan included in a high-heat-generating housing is usually higher than a rotation number of a fan included in other heat-generating housings, and therefore a volume of air taken in or exhausted by the high-heat-generating housing is larger than that of the other heat-generating housings. In this case, in a sealed space formed by use of aisle capping, such as an intake aisle, the other heat-generating housings disposed around the high-heat-generating housing are, by the high-heat-generating housing, deprived of air necessary for cooing. Further, high-temperature exhausted air exhausted from the high-heat-generating housing is mixed with intake/exhaust circulation of the other heat-generating housings, thereby causing temperature of the other heat-generating housings to rise.

As described above, the other heat-generating housings disposed around the high-heat-generating housing become unable to perform necessary cooling sufficiently because of being affected by intake/exhaust by the high-heat-generating housing, and therefore temperature of the other heat-generating housings rises. Specifically, a hot spot occurs in the other heat-generating housings. Further, when, for example, an air conditioner excessively supplies cool air to the inside of an intake aisle in order to avoid occurrence of such a hot spot, power for air-conditioning increases.

Therefore, when a high-heat-generating housing exists in a system in which an air-conditioning environment such as aisle capping is built, efficient avoidance of occurrence of a hot spot is a problem. PTLs 1 to 4 do not mention such a problem. A main object of the present invention is to provide a cooling system and the like that solve the problem.

Solution to Problem

A cooling system according to one aspect of the present invention includes:

a duct which is configured to be able to separate or substantially separate a first airflow and a second airflow, when, in such a way that an airflow taken in by a plurality of heat-generating housings and an airflow exhausted by the plurality of heat-generating housings are separated or substantially separated, the plurality of heat-generating housings being installed side by side in at least two rows, an enclosed space is formed by at least one of a plurality of surfaces forming an exterior shape of a shielding member, and an intake surface taking in air or an exhaust surface exhausting air among a plurality of surfaces forming an exterior shape of the plurality of heat-generating housings, the first airflow being taken in or exhausted by a specific heat-generating housing among the plurality of heat-generating housings, and the second airflow being taken in or exhausted by another of the heat-generating housings other than the specific heat-generating housing; and cooling enhancement means for enhancing cooling performance with respect to the specific heat-generating housing by acting on the first airflow.

In another view of achieving the above-described object, a cooling method according to one aspect of the present invention includes:

when, in such a way that an airflow taken in by a plurality of heat-generating housings and an airflow exhausted by the plurality of heat-generating housings are separated or substantially separated, the plurality of heat-generating housings being installed side by side in at least two rows, an enclosed space is formed by at least one of a plurality of surfaces forming an exterior shape of a shielding member, and an intake surface taking in air or an exhaust surface exhausting air among a plurality of surfaces forming an exterior shape of the plurality of heat-generating housings:

forming a duct in such a way as to be able to separate or substantially separate a first airflow being taken in or exhausted by a specific heat-generating housing among the plurality of heat-generating housings, and a second airflow being taken in or exhausted by another of the heat-generating housings other than the specific heat-generating housing; and enhancing cooling performance with respect to the specific heat-generating housing by cooling enhancement means acting on the first airflow.

Advantageous Effects of Invention

The present invention enables efficiently avoiding occurrence of a hot spot due to existence of a heat-generating housing having a high heating value, in a system in which an air-conditioning environment such as aisle capping is built.

EXAMPLE EMBODIMENT

Figure 1:
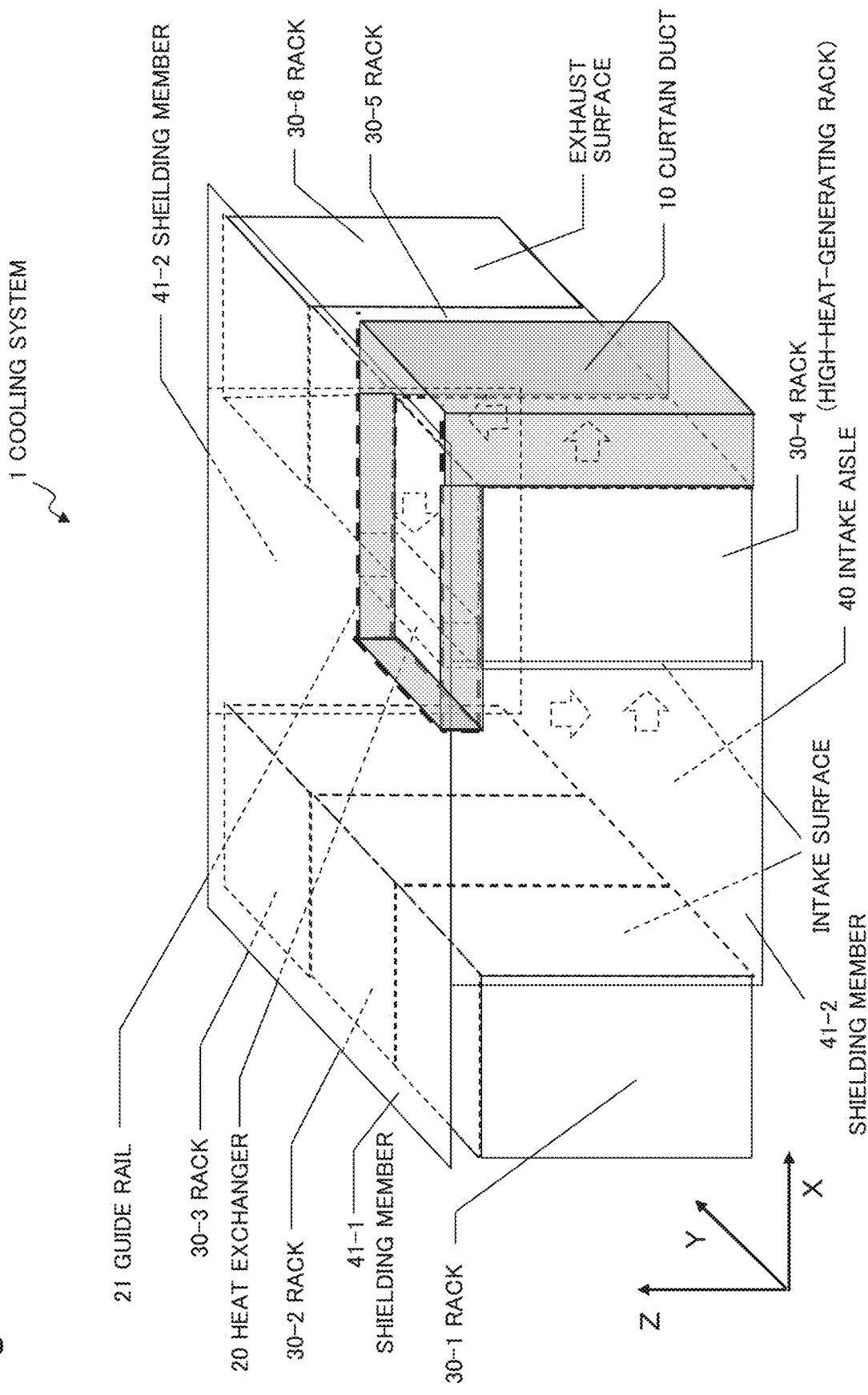
FIG. 1 is an oblique view of a cooling system 1 according to a first example embodiment of the present invention.

Hereinafter, example embodiments of the present invention will be described in detail with reference to the drawings. Note that, in the following description, a three-dimensional (X-Y-Z) coordinate is appropriately illustrated in the drawings, for convenience of description. In each example embodiment described in the following, an X axis direction and a Y axis direction are horizontal directions, and a Z axis direction is a vertical direction.

First Example Embodiment

Hereinafter, a cooling system 1 according to a first example embodiment of the present invention will be described with reference to FIGS. 1 to 4.

Figure 2:
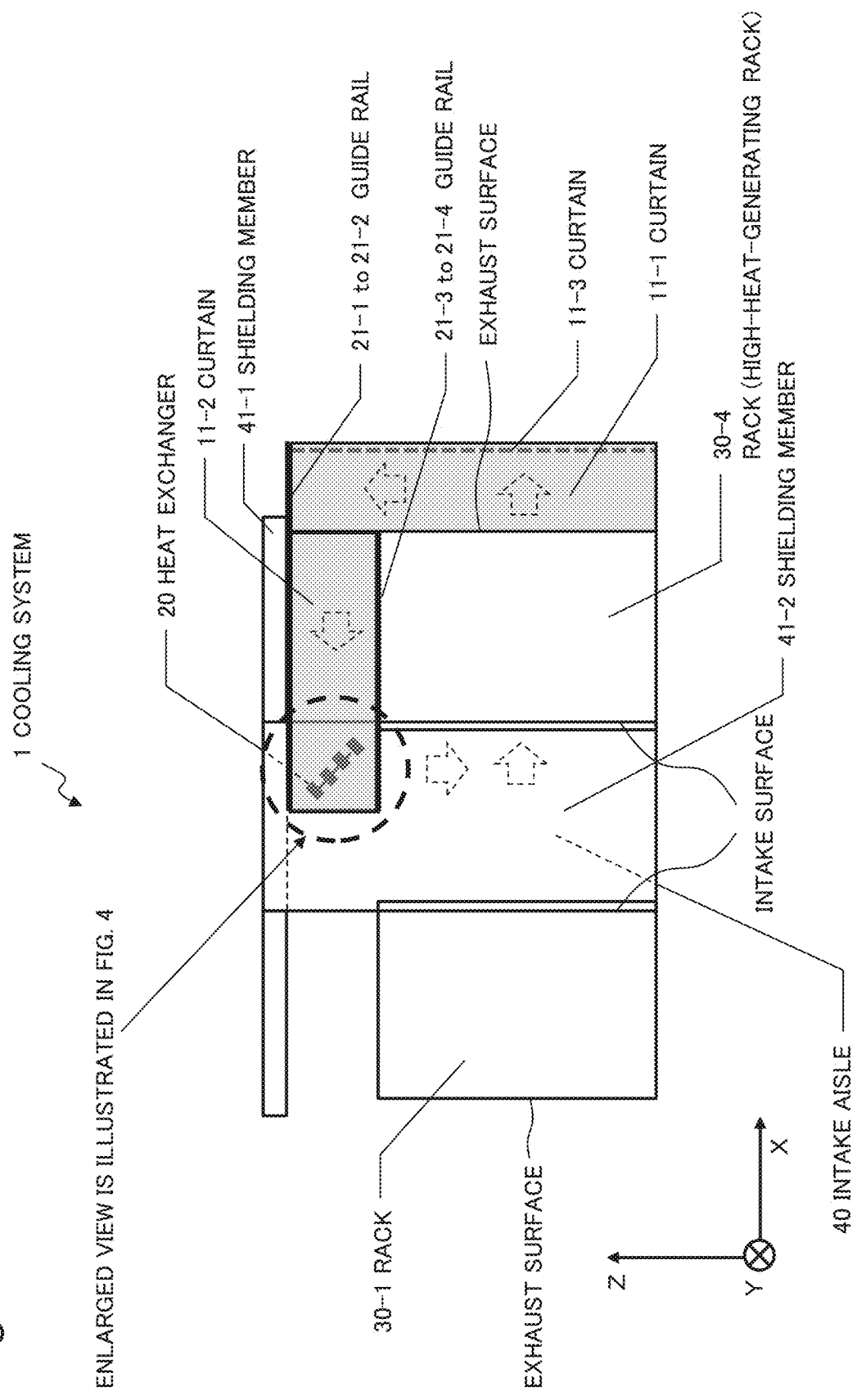
FIG. 2 is an XZ plane view (when a heat exchanger 20 is installed in an upper part of an intake surface side of a rack 30-4 [a high-heat-generating rack]) of the cooling system 1 according to the first example embodiment of the present invention as viewed in a positive direction of a Y axis.
Figure 3:
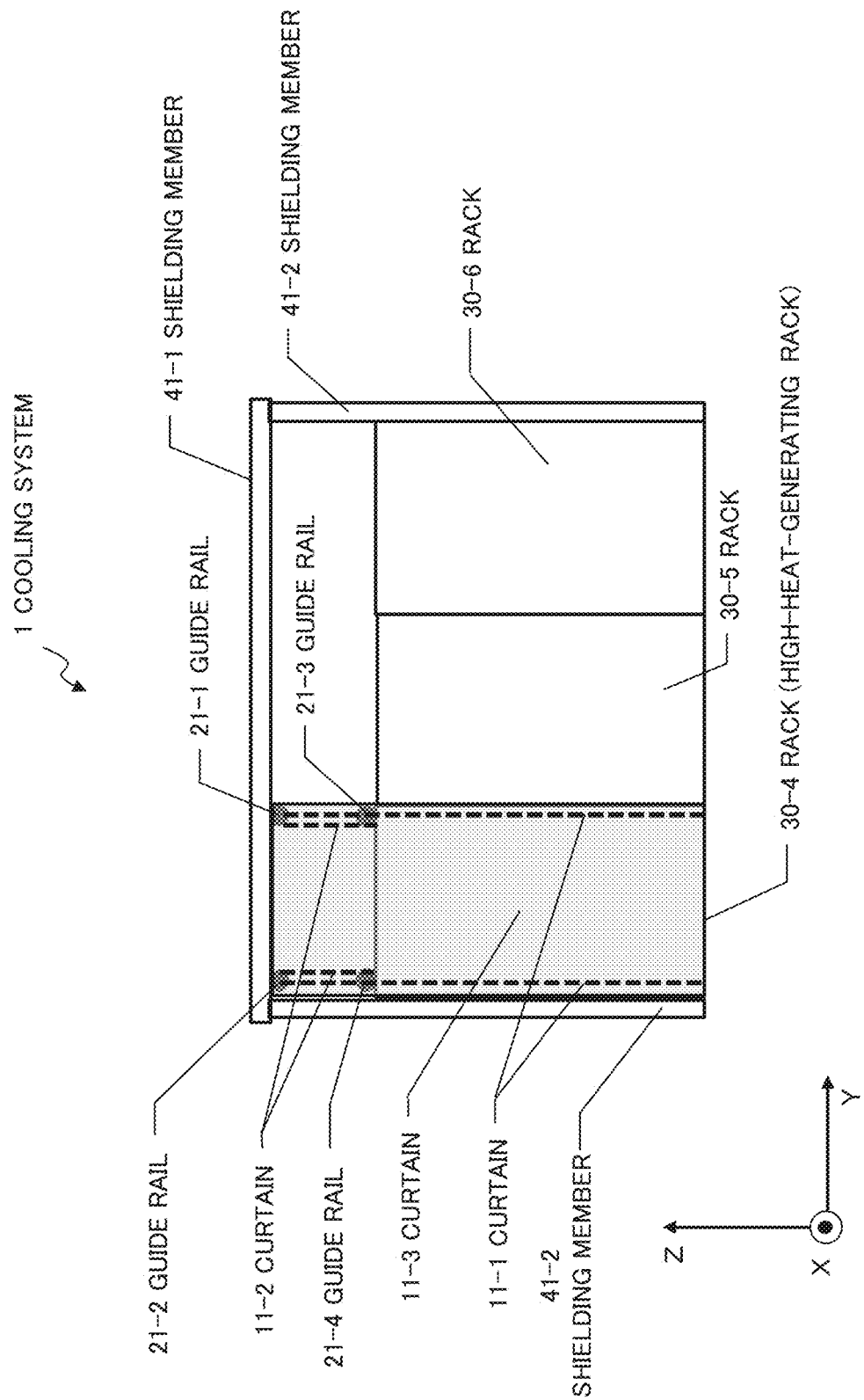
FIG. 3 is a YZ plane view of the cooling system 1 according to the first example embodiment of the present invention as viewed in a negative direction of an X axis.
Figure 4:
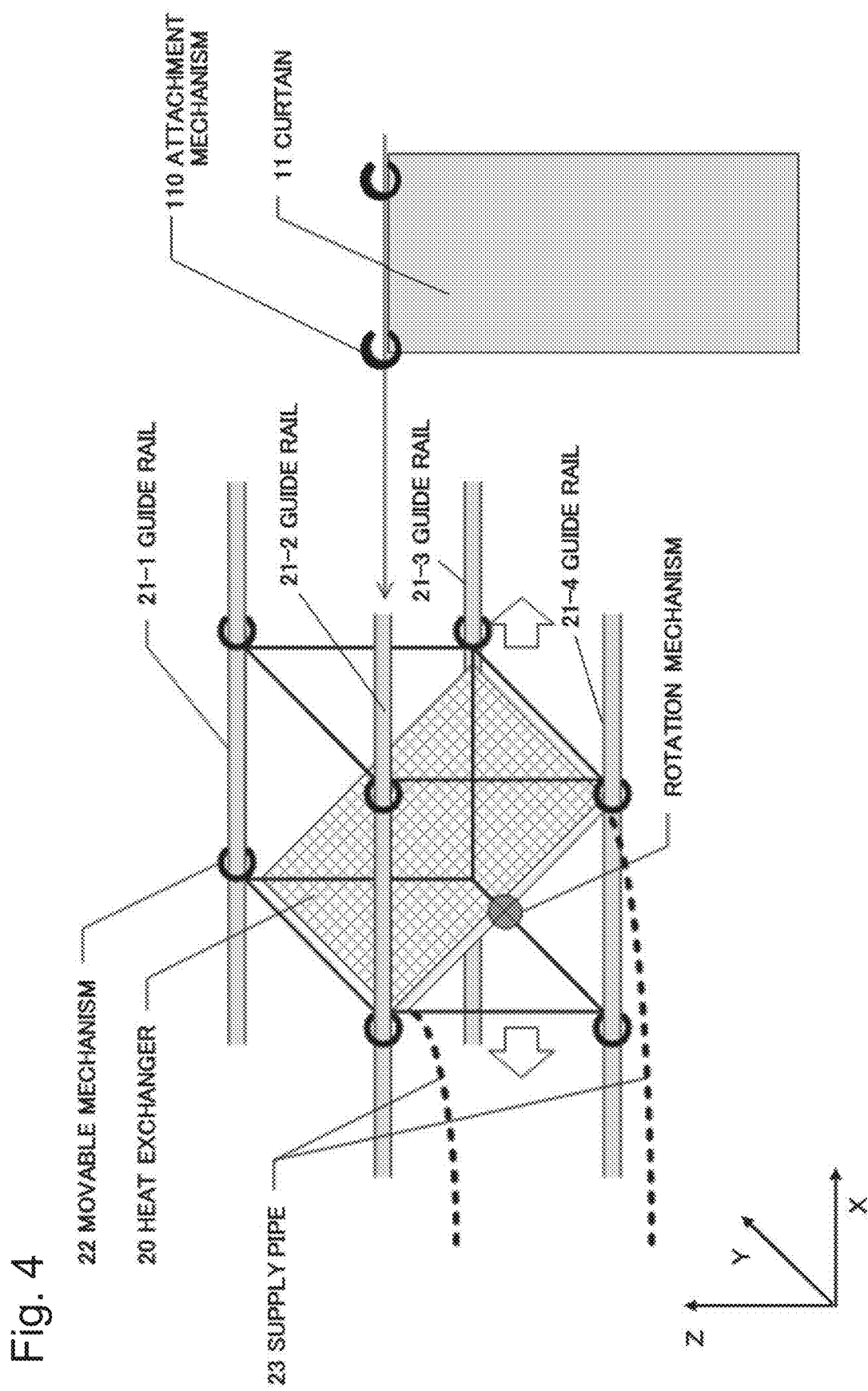
FIG. 4 is an enlarged oblique view of a peripheral part of the heat exchanger 20 in FIG. 2.

FIG. 1 is an oblique view of the cooling system 1 according to the first example embodiment of the present invention. FIG. 2 is an XZ plane view of the cooling system 1 according to the present example embodiment as viewed in a positive direction of a Y axis. In the cooling system 1 illustrated in FIG. 2, a heat exchanger 20 is installed in an upper part of an intake surface side of a rack 30-4. FIG. 3 is a YZ plane view of the cooling system 1 according to the present example embodiment as viewed in a negative direction of an X axis. FIG. 4 is an enlarged oblique view of a peripheral part of the heat exchanger 20 in FIG. 2.

The cooling system 1 illustrated in FIGS. 1 to 4 is a system in which an air-conditioning environment using aisle capping is built. The cooling system 1 includes a curtain duct 10, the heat exchanger 20, a guide rail 21, racks (heat-generating housings) 30-1 to 30-6, and shielding members 41-1 and 41-2.

The racks 30-1 to 30-6 are each mounted with an electronic device. Note that, in the following description of the present invention, it is assumed that the term "rack" refers to an electronic device mounted thereon. Further, the number of racks included in the cooling system 1 is not limited to six. As illustrated in FIG. 1, the racks 30-1 to 30-3 are installed side by side in one row in a Y axis direction. Similarly, the racks 30-4 to 30-6 are installed side by side in one row in the Y axis direction.

The racks 30-1 to 30-3 are each mounted in such a way that, among a plurality of surfaces forming an exterior shape of the rack, an intake surface that takes in air faces in a positive direction of an X axis, and an exhaust surface that exhausts air faces in a negative direction of the X axis. On the other hand, the racks 30-4 to 30-6 are each mounted in such a way that an intake surface thereof faces in the negative direction of the X axis, and an exhaust surface thereof faces in the positive direction of the X axis. Specifically, the racks 30-1 to 30-3 and the racks 30-4 to 30-6 are installed in such a way that the intake surfaces thereof are facing to each other across a space (an aisle). Note that, an arrow illustrated in FIGS. 1 and 2 indicates a direction of airflow being taken in or exhausted by the racks 30-1 to 30-6 (the same applies to FIGS. 6 and 8 to be described later).

As illustrated in FIG. 1, the shielding member 41-1 is attached to an upper part including a ceiling in a space (aisle) formed between a row including the racks 30-1 to 30-3 and a row including the racks 30-4 to 30-6, in such a way that airflow can be blocked or substantially blocked from an outside. Further, the shielding member 41-2 is attached to each of two parts to be entrances/exits of the aisle, in such a way that airflow can be blocked or substantially blocked from the outside. Note that, in the following description of the present invention, the shielding members 41-1 and 41-2 may be collectively referred to as a shielding member 41. A material of the shielding member 41 is, for example, plastic, vinyl, metal, or the like.

Further, as illustrated in the oblique view exemplified in FIG. 1, the shielding members 41-2 in two positions are each connected to the shielding member 41-1 at one end by, for example, integral formation, welding, fusion, or the like. Note that, the air-conditioning environment using aisle capping exemplified in FIG. 1 is one example, and the cooling system 1 may build, for example, an air-conditioning environment using aisle capping in a simpler form, using only the shielding member 41-1.

In this way, an intake aisle 40 being a space enclosed by an intake surface of the racks 30-1 to 30-3, an intake surface of the racks 30-4 to 30-6, and at least one of a plurality of surfaces forming an exterior shape of the shielding member 41 is formed. Further, cool air provided to the cooling system 1 from an air conditioner (not illustrated) is sent to an inside of the intake aisle 40 via, for example, an underfloor.

In the present example embodiment, among the racks 30-1 to 30-6, the rack 30-4 is assumed to be a high-heat-generating rack (high-heat-generating housing) mounted with an electronic device having a particularly high heating value. In this case, a curtain duct 10 is attached in proximity to the rack 30-4, and the heat exchanger 20 is installed inside the curtain duct 10. The curtain duct 10 is a duct that is formed in such a way as to be capable of separating or substantially separating an airflow (a first airflow) taken in or exhausted by the rack 30-4 and an airflow (a second airflow) taken in or exhausted by the racks 30-1 to 30-3, 30-5, and 30-6. Therefore, the first airflow flows inside the curtain duct 10, and the second airflow flows outside the curtain duct 10.

The curtain duct 10 illustrated in FIG. 1 includes a plurality of curtains (duct forming members) 11-1 to 11-3 illustrated in FIGS. 2 and 3. Note that, in the following description of the present invention, the curtains 11-1 to 11-3 may be collectively referred to as a curtain 11. A material of the curtain 11 may be any material capable of separating or substantially separating the first and the second airflows, and may be, for example, close-woven cloth, vinyl, plastic, metal, or the like.

As illustrated in FIGS. 1 to 3, the cooling system 1 forms the curtain duct 10 by the curtains 11-1 to 11-3 and an exhaust surface of the rack 30-4. As illustrated in FIG. 4, the curtain 11 is attached to a guide rail 21, in a state that the curtain 11 is suspended from the guide rail 21 (illustrated by a thick line in FIGS. 1 and 2) by use of an attachment mechanism 110. In the present example embodiment, the guide rail 21 is, more in detail, configured by four guide rails 21-1 to 21-4. Note that, a configuration of the guide rail 21 may be different from the configuration illustrated in FIG. 4. The guide rail 21 has a structure for allowing the curtain 11 and the heat exchanger 20 to be attached in proximity to the rack 30-4, and the guide rail 21 is attached, for example, to the shielding member 41-1 disposed above the rack 30-4 in such a way as to be parallel or approximately parallel to the X axis, as illustrated in FIGS. 2 and 3.

As illustrated in FIGS. 2 and 3, the curtain 11-1 is attached to the guide rail 21 in such a way as to be parallel or approximately parallel to an XZ plane in a state that the curtain 11-1 protrudes, from the exhaust surface of the rack 30-4, by a predetermined length in the positive direction of the X axis. The curtain 11-1 has a length from the guide rail 21 to a vicinity of a floor, in a Z axis direction. As illustrated in FIG. 3, there are two curtains 11-1, and each curtain 11-1 is attached to the guide rails 21-1 and 21-2 in such a way as to be formed in proximity to both side-boundaries of the rack 30-4 in the Y axis direction.

As illustrated in FIGS. 2 and 3, the curtain 11-2 is attached to the guide rail 21 in such a way as to surround a space above the rack 30-4, and dispose in parallel or approximately parallel to an XZ plane in a state that the curtain 11-2 protrudes, from an intake surface of the rack 30-4, by a predetermined length in the negative direction of the X axis. The curtain 11-2 has a length from the guide rails 21-1 and 21-2 to a vicinity of a top plate of the rack 30-4, in the Z axis direction. As illustrated in FIG. 3, there are two curtains 11-2, and each curtain 11-2 is attached to the guide rails 21-1 and 21-2 in such a way as to be formed in proximity to both side-boundaries of the rack 30-4 in the Y axis direction.

As illustrated in FIGS. 2 and 3, the curtain 11-3 is attached to the guide rails 21-1 and 21-2 in such a way as to be parallel or approximately parallel to the YZ plane at a predetermined length from the exhaust surface of the rack 30-4 in the positive direction of the X axis. The curtain 11-3 has a length from the guide rail 21 to a vicinity of the floor, in the Z axis direction.

When a member of the curtain 11 is cloth, vinyl, or the like, a weight may be attached to a lower part of the curtain 11, for example, in such a way as to reduce a flutter caused by airflow.

The heat exchanger 20 illustrated in FIGS. 1 and 4 has a function of cooling the first airflow by performing heat exchange using the first airflow flowing inside the curtain duct 10, and a coolant or water.

As illustrated in FIG. 4, the heat exchanger 20 is attached to the guide rails 21-1 to 21-4 by a movable mechanism 22. An installation position of the heat exchanger 20 can be changed in the X axis direction via the movable mechanism 22, by sliding the heat exchanger 20 along the guide rail 21. Note that, an arrow illustrated in FIG. 4 indicates a direction in which the heat exchanger 20 can be moved (the same applies to FIG. 7 to be described later).

Figure 5:
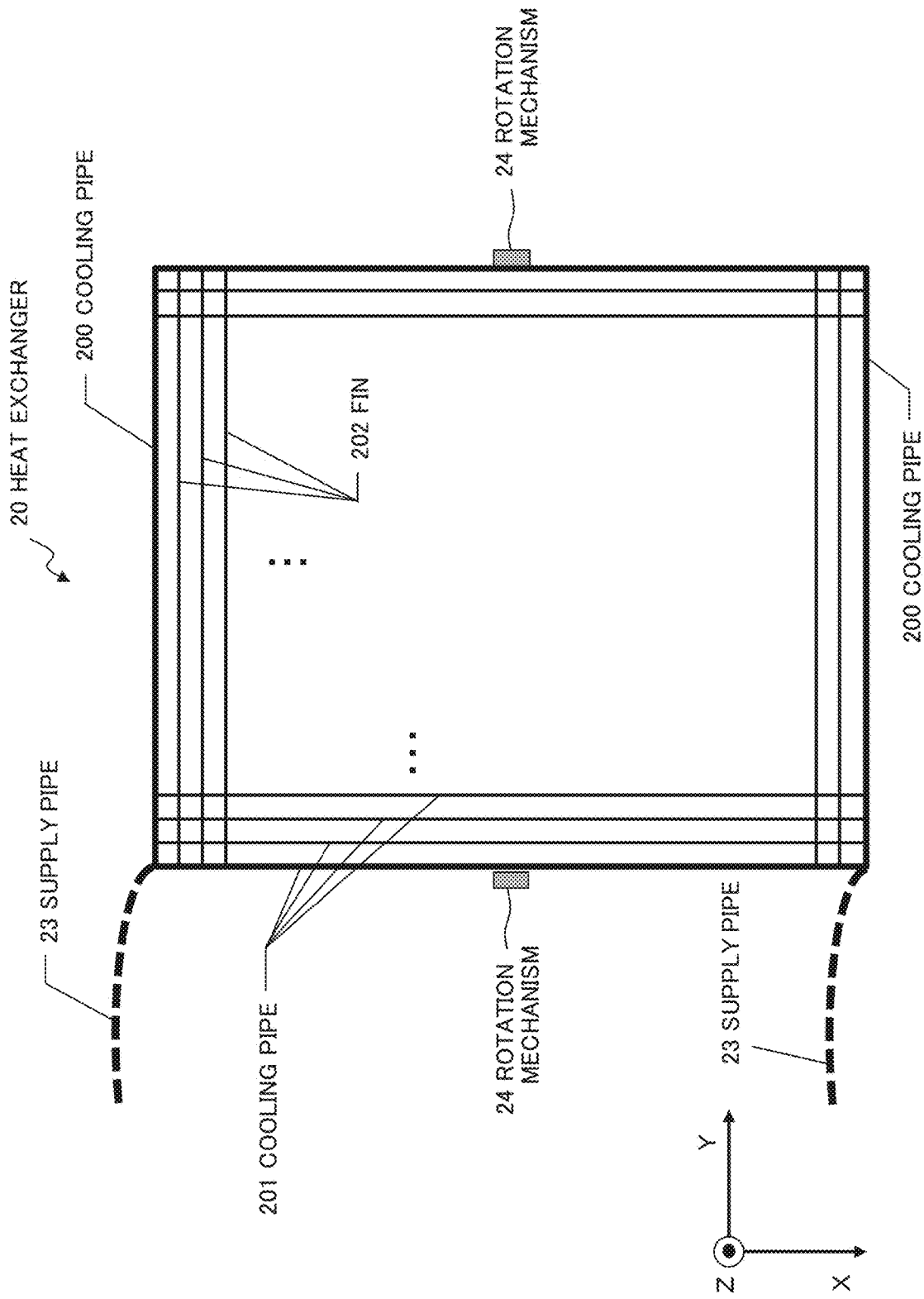
FIG. 5 is an XY plane view of the heat exchanger 20 illustrated in FIG. 4 as viewed in a negative direction of a Z axis.

FIG. 5 is an XY plane view of the heat exchanger 20 illustrated in FIG. 4 as viewed in a negative direction of the Z axis, and is a drawing illustrating details of the heat exchanger 20. The heat exchanger 20 includes cooling pipes 200 and 201, and a fin 202.

The cooling pipes 200 and 201 are pipes trough which a coolant or water flows. The cooling pipes 200 are two pipes formed in parallel (approximately parallel) to the Y axis direction. One of the cooling pipes 200 feeds a coolant or water which has flowed through one of two supply pipes 23 to the cooling pipe 201. Another cooling pipe 200 feeds the coolant or water which has flown through the cooling pipe 201 to another supply pipe 23.

The supply pipe 23 is a pipe through which a coolant or water flows between a device (not illustrated in FIGS. 1 to 5) that supplies a cooled coolant or cooled water to the heat exchanger 20, and the heat exchanger 20. The supply pipe 23 is made of a material having flexibility in such a way that a path can be flexibly changed according to a position of the heat exchanger 20. The supply pipe 23 is, for example, a resin pipe, rubber pipe, a metal flexible pipe, or the like.

In the heat exchanger 20, a plurality of cooling pipes 201 formed in parallel (approximately parallel) to the X axis direction and a plurality of fins 202 formed in parallel (approximately parallel) to the Y axis direction are disposed in a lattice shape. The fin 202 is, for example, a metal plate capable of performing heat exchange with a coolant or water flowing through the cooling pipe 201. The heat exchanger 20 performs, via the fin 202, heat exchange between the first airflow passing through the heat exchanger 20 while in contact with the fin 202, and a coolant or water flowing through the cooling pipe 201.

The heat exchanger 20 also includes a rotation mechanism 24, as illustrated in FIGS. 4 and 5. The rotation mechanism 24 is a mechanism capable of rotating the heat exchanger 20 around an axis in parallel or approximately parallel to the Y axis as the center. Since a common technique is adoptable as a structure itself of the rotation mechanism 24, a detailed description thereof is omitted.

When the heat exchanger 20 is installed in an upper part of the intake surface side of the rack 30-4 as illustrated in FIG. 2, the heat exchanger 20 is in a state of being installed, by the rotation mechanism 24, in such a way that an inclination is negative in the XZ plane, as illustrated in FIGS. 2 and 4. In this case, as illustrated in FIG. 2, the first airflow flowing from the exhaust surface side of the rack 30-4 through above the rack 30-4 toward the negative direction of the X axis comes in contact with the fin 202 in the heat exchanger 20, and thereby, a direction of the first airflow is changed to the negative direction of the Z axis.

Figure 6:
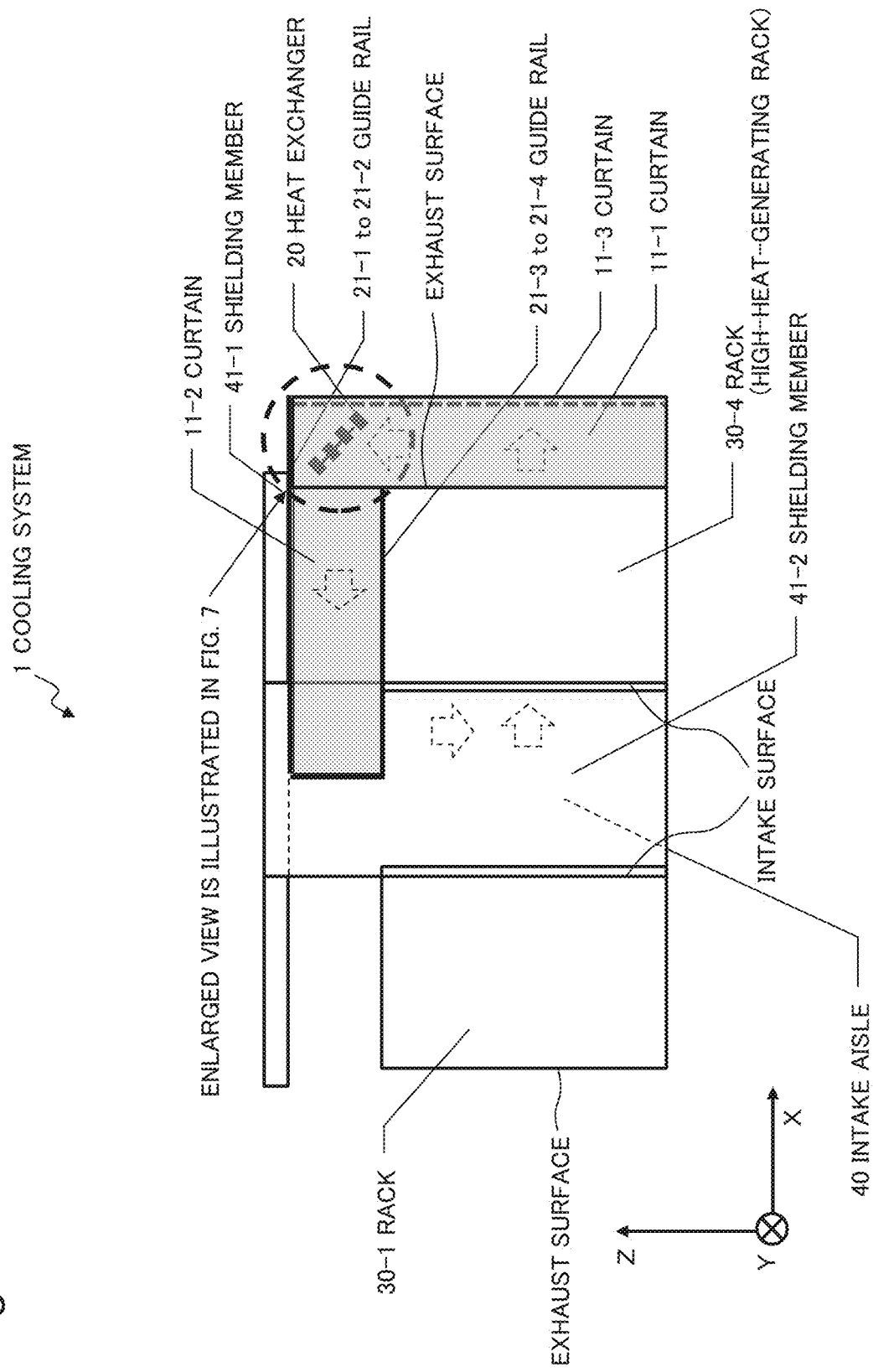
FIG. 6 is an XZ plane view (when the heat exchanger 20 is installed in an upper part of an exhaust surface side of the rack 30-4 [a high-heat-generating rack]) of the cooling system 1 according to the first example embodiment of the present invention as viewed in the positive direction of the Y axis.
Figure 7:
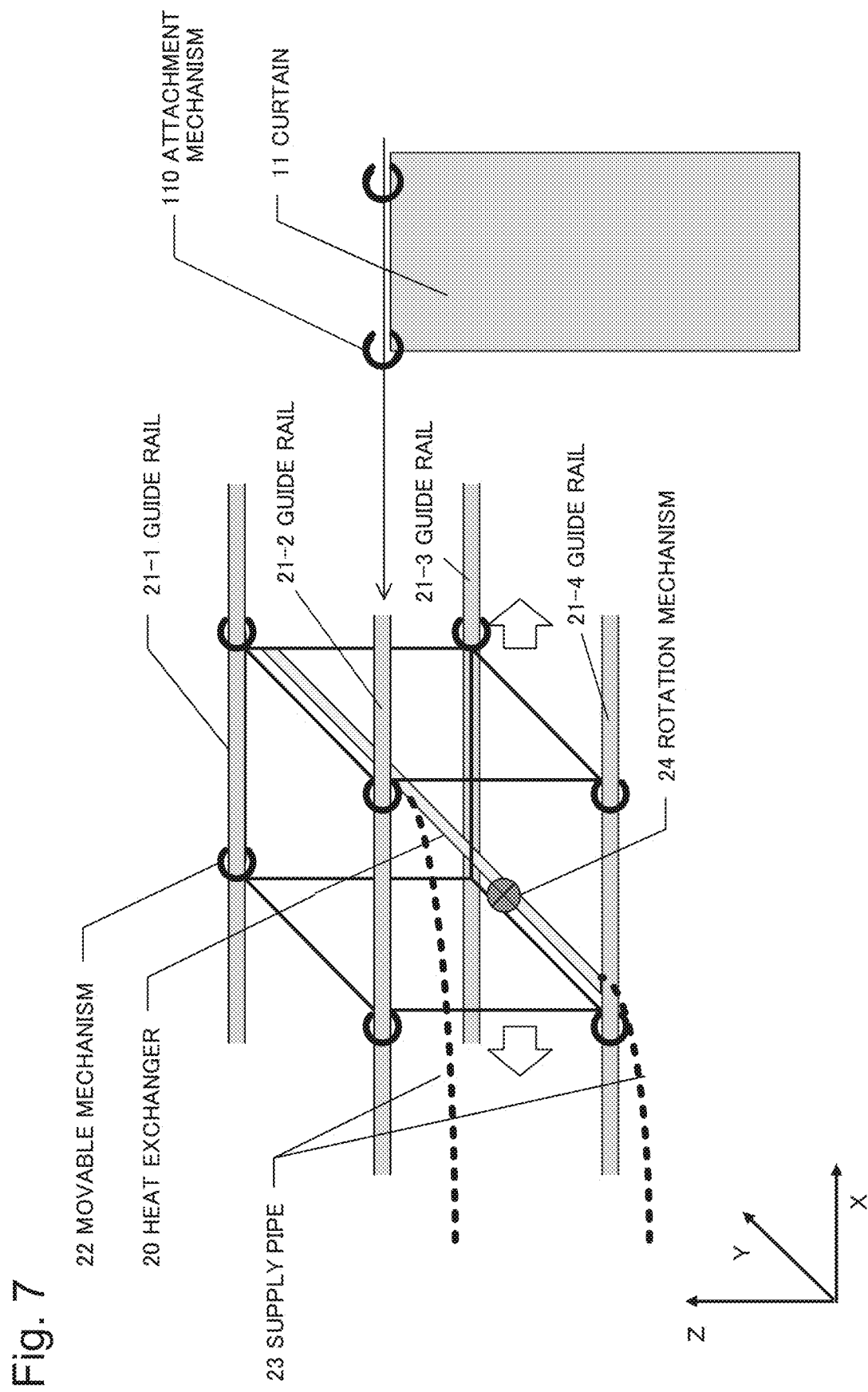
FIG. 7 is an enlarged oblique view of a peripheral part of the heat exchanger 20 in FIG. 6.

Alternatively, when the heat exchanger 20 is installed in an upper part of the exhaust surface side of the rack 30-4 as illustrated in FIG. 6, the heat exchanger is in a state of being installed, by the rotation mechanism 24, in such a way that an inclination is positive in the XZ plane, as illustrated in FIGS. 6 and 7. In this case, as illustrated in FIG. 6, the first airflow flowing through the exhaust surface side of the rack 30-4 toward a positive direction of the Z axis comes in contact with the fin 202 in the heat exchanger 20, and thereby, a direction of the first airflow is changed to the negative direction of the X axis.

In this way, the rotation mechanism 24 is able to change an orientation of the heat exchanger 20 in such a way that the first airflow can smoothly circulate inside the curtain duct 10 without disturbing, according to a position at which the heat exchanger 20 is installed.

The cooling system 1 according to the present example embodiment is able to efficiently avoid occurrence of a hot spot due to existence of a heat-generating housing having a high heating value, in a system in which an air-conditioning environment such as aisle capping is built. A reason for this is that the cooling system 1 forms a duct that is capable of separating or substantially separating a first airflow taken in and exhausted by a heat-generating housing having a high heating value and a second airflow taken in and exhausted by other heat-generating housings, and includes a cooling enhancement unit (heat exchanger) that enhances cooling performance with respect to the heat-generating housing having a high heating value by acting on the first airflow.

In the following, an advantageous effect achieved by the cooling system 1 according to the present example embodiment will be described in detail.

When a high-heat-generating housing exists in a system in which an air-conditioning environment such as aisle capping is built, other heat-generating housings disposed around the high-heat-generating housing is likely to be unable to efficiently perform necessary cooling because of being affected by intake and exhaust by the high-heat-generating housing, and therefore, a hot spot may occur in the other heat-generating housings. Specifically, a rotation number of a fan included in a high-heat-generating housing is usually higher than a rotation number of a fan included in other heat-generating housings, and therefore, in a sealed space formed by use of aisle capping, the other heat-generating housings disposed around the high-heat-generating housing are, by the high-heat-generating housing, deprived of air necessary for cooing. Further, high-temperature exhaust exhausted from the high-heat-generating housing is mixed with intake/exhaust circulation of the other heat-generating housings, thereby causing occurrence of a hot spot. Therefore, when a high-heat-generating housing exists in a system in which an air-conditioning environment such as aisle capping is built, efficient avoidance of occurrence of a hot spot is a problem.

Regarding the above-mentioned problem, the cooling system 1 according to the present example embodiment is a system in which an air-conditioning environment such as aisle capping is built, includes the curtain duct 10 and the heat exchanger 20, and is configured as described above with reference to FIGS. 1 to 7, for example. Specifically, the curtain duct 10 is formed in such a way as to be capable of separating or substantially separating a first airflow taken in or exhausted by a high-heat-generating electronic device (rack 30-4) among a plurality of electronic devices (racks 30-1 to 30-6), and a second airflow taken in or exhausted by the racks other than the rack 30-4. The heat exchanger 20 acts on the first airflow, and thereby enhances cooling performance with respect to the rack 30-4.

Specifically, since the cooling system 1 according to the present example embodiment builds, by using the curtain duct 10, a localized air-conditioning environment for a high-heat-generating electronic device, an influence exerted by exhaust and intake by the high-heat-generating electronic device on other electronic devices disposed around the high-heat-generating electronic device is reduced. Further, since the cooling system 1 is able to enhance cooling performance with respect to a high-heat-generating electronic device by using the heat exchanger 20, an influence exerted by the high-heat-generating electronic device on other electronic devices is further reduced. In this way, the cooling system 1 according to the present example embodiment is able to efficiently avoid occurrence of a hot spot due to existence of an electronic device having a high heating value, in a system in which an air-conditioning environment such as aisle capping is built.

Further, the shape of the curtain duct 10 according to the present example embodiment is not limited to a shape formed by the above-described curtains 11-1 to 11-3, as long as an advantageous effect of separating or substantially separating the first airflow and the second airflow is expected. For example, the curtain duct 10 may have a simpler shape that does not use the curtain 11-3. Alternatively, the curtain duct 10 may have a curtain having a length from the guide rail 21 to a vicinity of the floor in the Z axis direction on the intake surface side of the rack 30-4.

Further, since a position where the heat exchanger 20 according to the present example embodiment is installed is changeable via the guide rail 21, the heat exchanger 20 can be installed in a position where the heat exchanger 20 does not interfere with a member, such as a wired cable, installed in the system. Note that, instead of including the guide rail 21, the cooling system 1 may include a simpler structure that is capable of installing the heat exchanger 20 in at least one position among a plurality of positions inside the curtain duct 10. As one example thereof, the shielding member 41, for example, may include a structure that is capable of fixing the heat exchanger 20 to any one of the plurality of positions by a screw.

Further, the heat exchanger 20 according to the present example embodiment forms, in a lattice shape, the cooling pipe 201 through which a coolant or water flows and the fin 202, and includes the rotation mechanism 24 that is capable of changing a direction in which the first airflow in contact with the fin 202 advances. Therefore, the cooling system 1 according to the present example embodiment is able to facilitate circulation of first airflow inside the curtain duct 10 by appropriately changing, by use of the rotation mechanism 24, an orientation of the heat exchanger 20 according to a position in which the heat exchanger 20 is installed.

Further, since the supply pipe 23 that supplies a coolant or water to the heat exchanger 20 according to the present example embodiment is made of a material having flexibility, a path can be flexibly changed according to a position of the heat exchanger 20.

Further, the cooling system 1 according to the present example embodiment may include, instead of or in addition to the heat exchanger 20, an air blower that supports circulation of the first airflow inside the curtain duct 10 by the high-heat-generating electronic device. The air blower may be installed in a position where the air blower is able to act on the first airflow. More specifically, for example, similarly to the heat exchanger 20 illustrated in FIG. 2 or 6, the air blower may be installed in any one of positions in the X axis direction inside the curtain duct 10 disposed above the rack 30-4. Alternatively, the air blower may be installed in an underfloor communicating with the curtain duct 10 disposed on the exhaust surface side of the rack 30-4.

Further, a device mounted on the racks 30-1 to 30-6 according to the present example embodiment is not limited to an electronic device. The racks 30-1 to 30-6 may be mounted with a heat-generating device which a power source (an internal-combustion engine) such as an engine is installed inside and in need of being cooled by air-conditioning.

Second Example Embodiment

Figure 8:
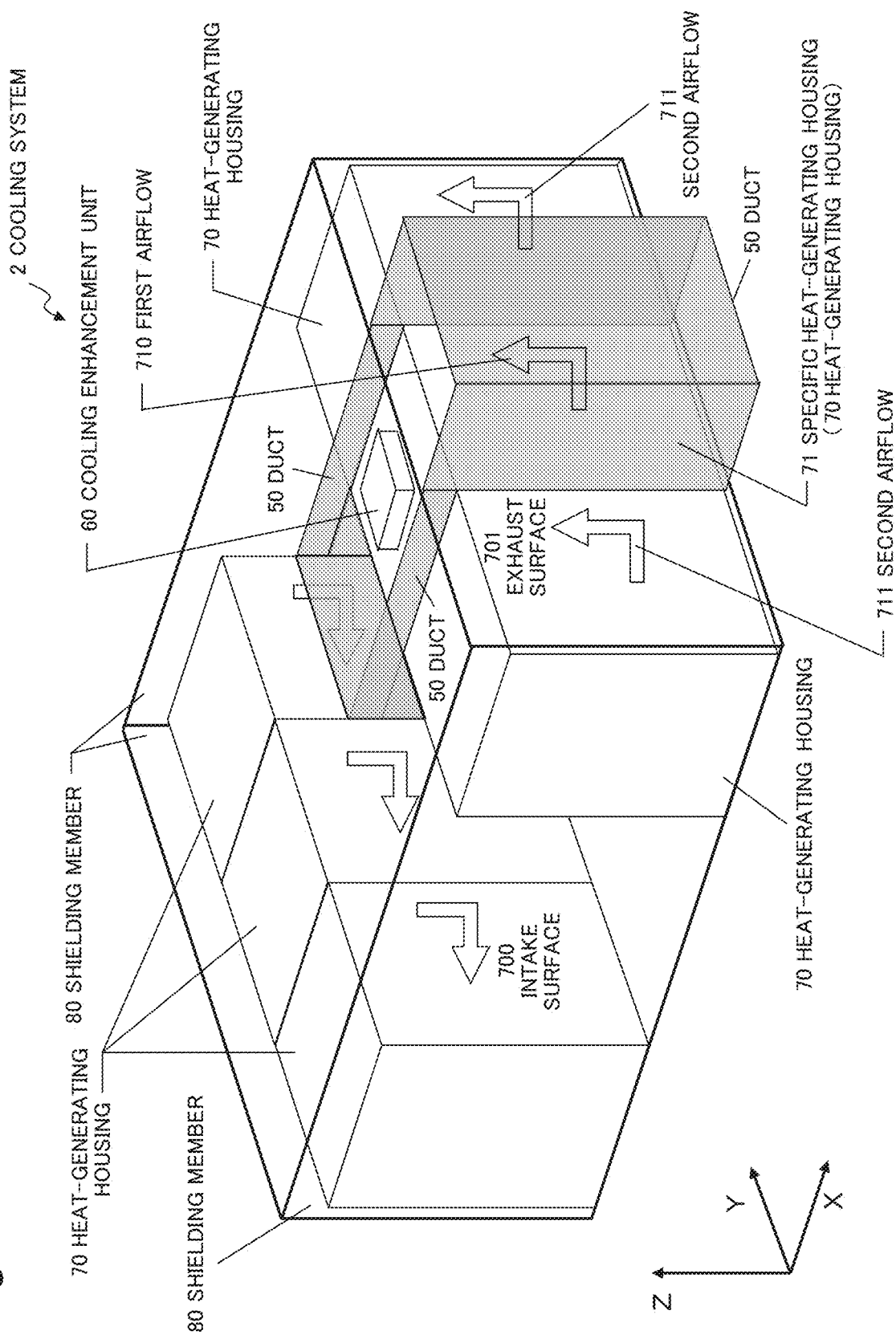
FIG. 8 is an oblique view of a cooling system 2 according to a second example embodiment of the present invention.

FIG. 8 is an oblique view of a cooling system 2 according to a second example embodiment of the present application.

In the cooling system 2 according to the present example embodiment, a plurality of heat-generating housings 70 are installed side by side in at least two rows. Further, in the cooling system 2, an enclosed space is formed by at least one of a plurality of surfaces forming an exterior shape of a shielding member 80 and, among a plurality of surfaces forming an exterior shape of the plurality of heat-generating housings 70, an intake surface 700 that takes in air or an exhaust surface 701 that exhausts air. Thereby, in the cooling system 2, an airflow taken in by the plurality of heat-generating housings 70 and an airflow exhausted by the plurality of heat-generating housings 70 are separated or substantially separated.

Further, the cooling system 2 according to the present example embodiment includes a duct 50 and a cooling enhancement unit 60.

The duct 50 is formed in such a way as to be able to separate or substantially separate a first airflow 710 being taken in or exhausted by a specific heat-generating housing 71 having a high heating value among the plurality of heat-generating housings 70, and a second airflow 711 being taken in or exhausted by the heat-generating housings 70 other than the specific heat-generating housing 71.

The cooing enhancement unit 60 enhances cooling performance with respect to the specific heat-generating housing 71 by acting on the first airflow 710.

The cooling system 2 according to the present example embodiment is able to efficiently avoid occurrence of a hot spot due to existence of the heat-generating housing 70 having a high heating value, in a system in which an air-conditioning environment such as aisle capping is built. A reason for this is that the cooling system 2 forms a duct 50 capable of separating a first airflow taken in or exhausted by the heat-generating housing 70 having a high heating value and a second airflow taken in or exhausted by other heat-generating housings, and includes the cooling enhancement unit 60 that enhances cooling performance with respect to the heat-generating housing 70 having a high heating value by acting on the first airflow.

The present invention has been described above with reference to the above-described example embodiments as exemplary examples. However, the present invention is not limited to the above-described example embodiments. Specifically, various aspects that can be understood by those skilled in the art is applicable to the present invention within the scope of the present invention.

Note that, the whole or a part of each example embodiment described above may also be described as a supplementary note in the following. However, the present invention described with reference to each of the above-described example embodiments by way of an example is not limited to the following.

(Supplementary Note 1)

A cooling system including:

a duct which is configured to be able to separate or substantially separate a first airflow and a second airflow, when, in such a way that an airflow taken in by a plurality of heat-generating housings and an airflow exhausted by the plurality of heat-generating housings are separated or substantially separated, the plurality of heat-generating housings being installed side by side in at least two rows, an enclosed space is formed by at least one of a plurality of surfaces forming an exterior shape of a shielding member, and an intake surface taking in air or an exhaust surface exhausting air among a plurality of surfaces forming an exterior shape of the plurality of heat-generating housings, the first airflow being taken in or exhausted by a specific heat-generating housing among the plurality of heat-generating housings, and the second airflow being taken in or exhausted by another of the heat-generating housings other than the specific heat-generating housing; and cooling enhancement means for enhancing cooling performance with respect to the specific heat-generating housing by acting on the first airflow.

(Supplementary Note 2)

The cooling system according to Supplementary Note 1, wherein the duct includes a duct forming member, and forms a space through which the first airflow passes, by enclosing the space with a surface included in the duct forming member, and an intake surface or an exhaust surface being included in the specific heat-generating housing.

(Supplementary Note 3)

The cooling system according to Supplementary Note 2, further including the shielding member, wherein the shielding member includes a structure being able to hang, from above the specific heat-generating housing, the duct forming member.

(Supplementary Note 4)

The cooling system according to Supplementary Note 2 or 3, wherein a material of the duct forming member is cloth, vinyl, plastic, or metal.

(Supplementary Note 5)

The cooling system according to Supplementary Note 1, wherein the cooling enhancement means is a heat exchanger for performing heat exchange between the first airflow and a coolant or water.

(Supplementary Note 6)

The cooling system according to Supplementary Note 5, wherein the heat exchanger forms, in a lattice shape, a cooling pipe in which the coolant or water flows and a fin, and includes a rotation mechanism being able to change a direction in which the first airflow in contact with the fin advances.

(Supplementary Note 7)

The cooling system according to Supplementary Note 5 or 6, further including a supply pipe, having flexibility, in which the coolant or water being supplied to the cooling enhancement means flows.

(Supplementary Note 8)

The cooling system according to Supplementary Note 7, wherein the supply pipe is a resin pipe, a rubber pipe, or a metal flexible pipe.

(Supplementary Note 9)

The cooling system according to any one of Supplementary Notes 1 to 4, wherein the cooling enhancement means is an air blower supporting circulation of the first airflow inside the duct.

(Supplementary Note 10)

The cooling system according to any one of Supplementary Notes 1 to 9, wherein the cooling enhancement means is installable in at least one of a plurality of positions inside the duct.

(Supplementary Note 11)

The cooling system according to Supplementary Note 10, further including a guide rail supporting movement of the cooling enhancement means.

(Supplementary Note 12)

The cooling system according to Supplementary Note 11, wherein the guide rail is attached to the shielding member.

(Supplementary Note 13)

A cooling method including, when, in such a way that an airflow taken in by a plurality of heat-generating housings and an airflow exhausted by the plurality of heat-generating housings are separated or substantially separated, the plurality of heat-generating housings being installed side by side in at least two rows, an enclosed space is formed by at least one of a plurality of surfaces forming an exterior shape of a shielding member, and an intake surface taking in air or an exhaust surface exhausting air among a plurality of surfaces forming an exterior shape of the plurality of heat-generating housings:

forming a duct in such a way as to be able to separate or substantially separate a first airflow being taken in or exhausted by a specific heat-generating housing among the plurality of heat-generating housings, and a second airflow being taken in or exhausted by another of the heat-generating housings other than the specific heat-generating housing; and enhancing cooling performance with respect to the specific heat-generating housing by cooling enhancement means acting on the first airflow.

REFERENCE SIGNS LIST

1 Cooling system
10 Curtain duct
11 Curtain
110 Attachment mechanism
20 Heat exchanger
21 Guide rail
22 Movable mechanism
23 Supply pipe
24 Rotation mechanism
200, 201 Cooling pipe
202 Fin
30-1 to 30-6 Rack
40 Intake aisle
41 Shielding member
41-1, 41-2 Shielding member
2 Cooling system
50 Duct
60 Cooling enhancement unit
70 Heat-generating housing
700 Intake surface
701 Exhaust surface
71 Specific heat-generating housing
710 First airflow
711 Second airflow
80 Shielding member

What is claimed is:

1. A cooling system comprising;

a duct which is configured to be able to separate or substantially separate a first airflow and a second airflow, when, in such a way that an airflow taken in by a plurality of heat-generating housings and an airflow exhausted by the plurality of heat-generating housings are separated or substantially separated, the plurality of heat-generating housings being installed side by side in at least two rows, an enclosed space is formed by at least one of a plurality of surfaces forming an exterior shape of a shielding member, and an intake surface taking in air or an exhaust surface exhausting air among a plurality of surfaces forming an exterior shape of the plurality of heat-generating housings, the first airflow being taken in or exhausted by a specific heat-generating housing among the plurality of heat-generating housings, and the second airflow being taken in or exhausted by another of the heat-generating housings other than the specific heat-generating housing; and a cooler for enhancing cooling performance with respect to the specific heat-generating housing by acting on the first airflow.

2. The cooling system according to claim 1, wherein the duct includes a duct forming member, and forms a space through which the first airflow passes, by enclosing the space with a surface included in the duct forming member, and an intake surface or an exhaust surface being included in the specific heat-generating housing.

3. The cooling system according to claim 2, further comprising the shielding member, wherein the shielding member includes a structure being able to hang, from above the specific heat-generating housing, the duct forming member.

4. The cooling system according to claim 2, wherein a material of the duct forming member is cloth, vinyl, plastic, or metal.

5. The cooling system according to claim 1, wherein the cooler is a heat exchanger for performing heat exchange between the first airflow and a coolant or water.

6. The cooling system according to claim 5, wherein the heat exchanger forms, in a lattice shape, a cooling pipe in which the coolant or water flows and a fin, and includes a rotation mechanism being able to change a direction in which the first airflow in contact with the fin advances.

7. The cooling system according to claim 5, further comprising a supply pipe, having flexibility, in which the coolant or water being supplied to the cooler flows.

8. The cooling system according to claim 7, wherein the supply pipe is a resin pipe, a rubber pipe, or a metal flexible pipe.

9. The cooling system according to claim 1, wherein the cooler is an air blower supporting circulation of the first airflow inside the duct.

10. The cooling system according to claim 1, wherein the cooler is installable in at least one of a plurality of positions inside the duct.

11. The cooling system according to claim 10, further comprising a guide rail supporting movement of the cooler.

12. The cooling system according to claim 11, wherein the guide rail is attached to the shielding member.

13. A cooling method comprising, when, in such a way that an airflow taken in by a plurality of heat-generating housings and an airflow exhausted by the plurality of heat-generating housings are separated or substantially separated, the plurality of heat-generating housings being installed side by side in at least two rows, an enclosed space is formed by at least one of a plurality of surfaces forming an exterior shape of a shielding member, and an intake surface taking in air or an exhaust surface exhausting air among a plurality of surfaces forming an exterior shape of the plurality of heat-generating housings:

separating or substantially separating a first airflow and a second airflow by a duct, the first airflow being taken in or exhausted by a specific heat-generating housing among the plurality of heat-generating housings, and the second airflow being taken in or exhausted by another of the heat-generating housings other than the specific heat-generating housing; and enhancing cooling performance with respect to the specific heat-generating housing by a cooler acting on the first airflow.

* * * * *